United States Patent [19]

Levinthal

[11] 4,133,047

[45] * Jan. 2, 1979

[54] SYSTEM FOR STORING AND RETRIEVING INFORMATION AT THE MOLECULAR LEVEL

[76] Inventor: Cyrus Levinthal, 435 Riverside Dr., New York, N.Y. 10025

[*] Notice: The portion of the term of this patent subsequent to Jul. 5, 1994, has been disclaimed.

[21] Appl. No.: 549,450

[22] Filed: Feb. 12, 1975

[51] Int. Cl.² .................................................. G11C 11/26
[52] U.S. Cl. .................................... 365/118; 365/128; 313/391
[58] Field of Search .................. 340/173 NI; 313/391; 365/118, 128

[56] References Cited

U.S. PATENT DOCUMENTS

| 3,119,099 | 1/1964 | Biernat | 340/173 NI |
| 3,215,988 | 11/1965 | Clapp | 340/173 NI |

Primary Examiner—Terrell W. Fears
Attorney, Agent, or Firm—Cooper, Dunham, Clark, Griffin & Moran

[57] ABSTRACT

Dislosed is a system for retrievably storing information in a storage medium comprising a laterally extending regular lattice of substantially identical units. Each unit is approximately the size of a large biological molecule or a virus (i.e. several hundred Angstroms or less), and can in fact be a single biological molecule, a single virus, or an equivalent particle or aggregate. Any individual unit can be selectively modified by a narrowly focused electron beam without affecting adjacent units, to thereby store (write in) information as a pattern of modified lattice units. After a lattice has been so modified, it can be stabilized by depositing thereon a thin metallic layer, and the stored information can be read out by a detecting electron beam.

10 Claims, 20 Drawing Figures

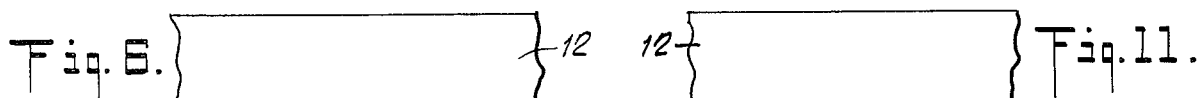
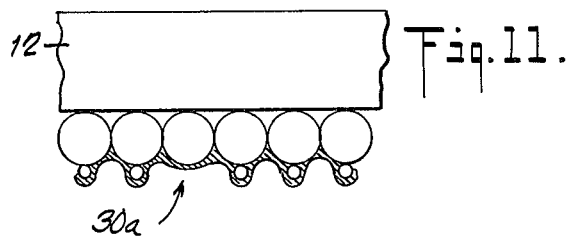
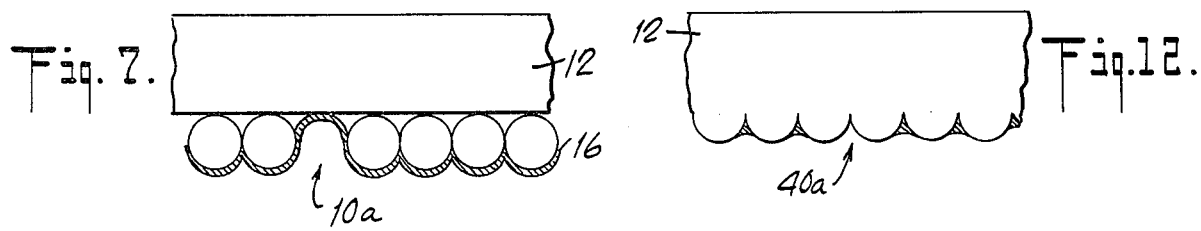
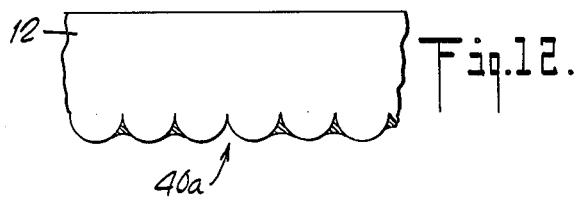
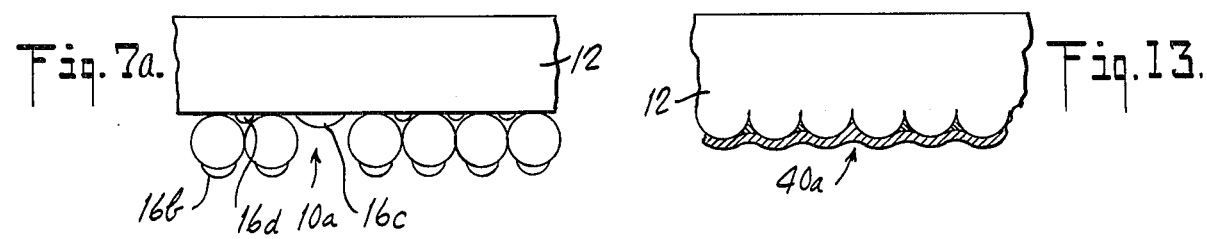
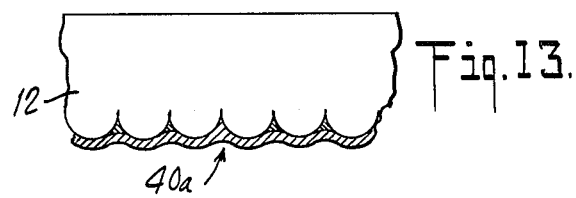
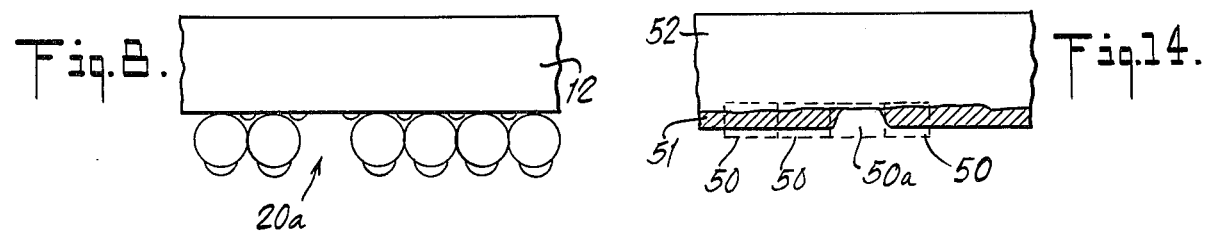
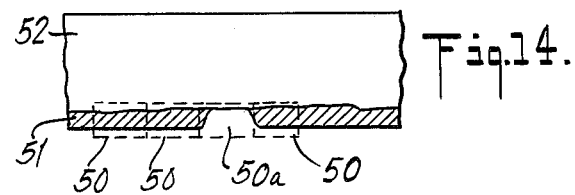
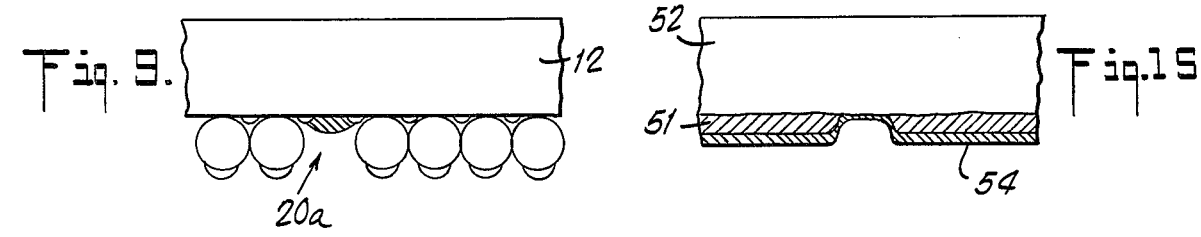
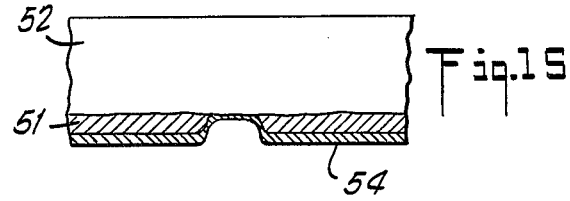
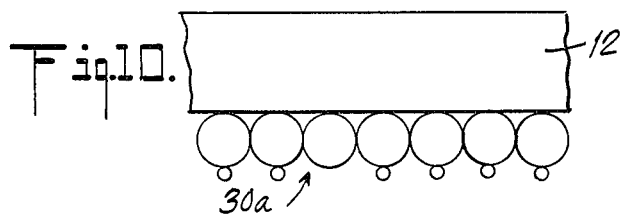

SYSTEM FOR STORING AND RETRIEVING INFORMATION AT THE MOLECULAR LEVEL

BACKGROUND OF THE INVENTION

The invention is in the field of information storage and retrieval systems, and relates to memories, such as computer memories. The invention is specifically directed to a memory which is very small in size but can store a very large amount of information.

There is an ever growing need for efficiently storing and retrieving large amounts of information, and there are many different storage systems which try to optimize, to varying degrees, factors such as storage capacity, access time, size, cost and the like. The problem is particularly severe where it is desired to store a very large amount of information and to have any portion of it accessible in a minimum time, e.g. the problem of storing the Chemical Abstracts or the problem of storing the inventory records of all the space parts maintained by the Navy throughout the world. The memories typically used at present, such as magnetic core and semiconductor and similar memories, are satisfactory for many uses, but do not have sufficiently high storage density for many other uses. Research efforts have therefore been directed to alternate storage techniques, such as optical storage. An example of such techniques is the Unicon 690 Laser Store for the Iliac IV computer installation, which has a storage density of about $2.7 \times 10^7$ bits per square inch. Even with optical memories, however, the diffraction limit of the imaging lens imposes a theoretical limit of about $10^8$ bits square inch, and there is a major technical difficulty in providing high beam deflection to cover a large field. There, are additionally, optical storage memories which employ light sensitive color centers (F-centers, M-centers and $M_A$-centers) in crystals — as discussed, for example, in U.S. Pat. Nos. 3,440,642, 3,673,578, and 3,720,926, but since again light beams are involved in such memories, the same theoretical limit of about $10^8$ bits per square inch is present. A somewhat different approach is taken when using electron beam modification of storage media. For example, U.S. Pat. No. 3,723,978 relates to a technique using an electron beam to locally charge portions of a storage medium which retain the charge for up to fifty hours, while U.S. Pat. No. 3,760,383 relates to a technique for permanent local thermal destruction of selected macroscopic portions of a storage medium by an electron beam. It appears, however, that the storage density of such electron beam systems is no better than with the optical systems discussed above.

SUMMARY OF THE INVENTION

An object of the invention is to provide a memory for efficiently storing information at a very high density.

The typical storage medium used in the invented system is a laterally extending regular lattice of substantially identical units. Each unit is about the size of an organic molecule or a virus or an equivalent particle or aggregate, e.g. several hundred Angstroms or less. Each unit may in fact be a single, wholly or primarily organic particle, e.g. a single portion molecule, a single virus, or a single equivalent particle. Alternatively, each unit can be a pair consisting of a larger and a smaller particle, where each particle can be an organic molecule, a virus, or an equivalent particle. Still alternately, each unit can be an aggregate of particles, where each particle is substantially smaller than the unit size. A unit may be provided with an inorganic cap to facilitate the modification of the unit in accordance with the invention.

To write information into the storage medium, an electron beam focused to a size comparable to the unit size irradiates one or more selected individual units with sufficient energy to modify them. The modification mechanism is believed to involve the ejection of secondary electrons from the irradiated unit and the rupture of covalent chemical bonds therein, and to possibly involve electrostatic repulsion between parts of the unit. The beam is finely focused and precisely indexed to each selected unit, so that the modification of one unit does not affect adjacent units. "Modification" in this context means a change in the visible structure of the unit (including a removal of the unit or a portion thereof from the lattice), and "visible" means a change detectable by an electron beam of the same general type either immediately after writing information into the lattice or after the lattice has been stabilized — as by depositing thereon a thin metallic film, so that further irradiation does not modify it.

BRIEF DESCRIPTION OF THE DRAWINGS

FIGS. 6, 8, 10, 12 and 14 illustrate the media of FIGS. 1-5, respectively, after a unit of each has been modified.

FIGS. 7 and 7a, 9, 11, 13 and 15 illustrate the media of FIGS. 6, 8, 10, 12 and 14, respectively, after a stabilization thereof by metallic deposition.

DETAILED DESCRIPTION

An object of the invention is to retrievably store information at the molecular level, i.e. to store one bit of information per one unit of a storage medium comprising units each comparable in size to a single organic molecule, a single virus or an equivalent particle or aggregate (i.e. several hundred Angstroms or less).

The invented storage medium is a laterally extending, e.g. substantially two-dimensional, regular lattice of units which are sufficiently identical to each other to react in substantially the same manner to a finely focused electron beam and to form a regular array where each unit can be accurately found by its position within the array. Each unit must be sufficiently large in size so as to be comparable to the smallest practical electron beam size, and each unit must be easily and effectively modifiable by an electron beam. In the context of this specification, the term "modification" is used to mean any modification of the properties of a unit (including the removal of a unit or a portion thereof from the lattice) which does not substantially affect adjacent units and which can be viewed subsequently by a generally similar type electron beam (typically after stabilization of the lattice).

Figure 1:
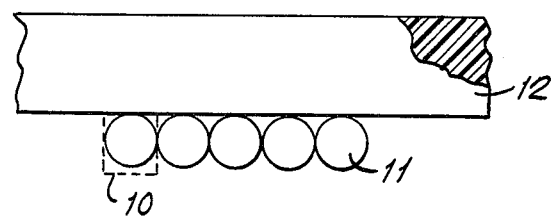
FIGS. 1 through 5 illustrate five different types of storage media in accordance with the invention.

Several examples of such storage media are illustrated schematically in FIGS. 1 through 5. Referring to FIG. 1, the storage medium is a laterally extending regular lattice (along a plane perpendicular to the drawing sheet) of substantially identical units 10, where each unit 10 is capable of storing one bit of information, and each is associated with an adjacent laterally extending support 12. Each unit 10 is a single particle 11, where "particle" in this specification means a single organic molecule, a single virus, or a single equivalent particle. The lattice of units 10 can be a naturally occurring two-dimensional lattice of particles 11, for example, one of the naturally occurring crystalline lattices of the types discussed in: Furneaux, P. J. S. et al., "Crystalline Protein in the Chorion of Insect Egg Shells", *J. Ultrastructure Research*, Vol. 38, 1972, pp. 343-359; Weintraub, M. et al., "Electron Microscopy of the Bean and Cowpea Strains of Southern Bean Mosaic Virus Within Leaf Cells", *J. Ultrastructure Research*, Vol. 32, 1970, pp. 167-189; Davis, L. E., "Intramitochondrial Crystals in Hydra", *Academic Press Inc.*, 1967, pp. 125-133; and Goodenough, D. A. et al., "The Isolation of Mouse Hepatocyte Gap Junctions", *The Journal of Cell Biology*, Vol. 34, 1972, pp. 646-656. Alternately, the lattice shown in FIG. 1 can be formed by purifying and crystallizing suitable substances, as discussed in: Labaw, L. W. et al., "The Molecular Outline of Human YG1 Immunoglobulin from an EM Study of Crystals", *J. Ultrastructure Research*, Vol. 40, 1972, pp. 349-365; and Derosier, D. J. et al., "Crystallization and Preliminary Structural Analysis of Dihydrolipoyl Transsuccinylase", the Core of the 2-Oxoglutarate Dehydrogenase Complex, Proc. Nat. Acad. Sci. USA, Vol. 68, No. 6, 1971, pp. 1135-1137. Lattices of this type, either naturally occurring or chemically created, have densities of the order of $10^{11}$ to $10^{12}$ units per cm$^2$.

When subjected to suitable electron beam radiation, each irradiated unit of lattices of this type is modified as discussed, for example, in: Breedlove, Jr., J. R. et al., "Molecular Microscopy: Fundamental Limitations", *Science*, 1970, pp. 1310-1313; Williams, R. C. et al., "Electron Microscopy of Tobacco Mosaic Virus Under Conditions of Minimal Beam Exposure", *J. Mol. Biol.*, Vol. 52, 1970, pp. 121-123; Isaacson, M. et al., "Electron Beam Excitation and Damage of Biological Molecules; Its Implications for Specimen Damage in Electron Microscopy[1]", *Radiation Research*, Vol. 55, 1973, pp. 205-224; Glaeser, R. M., "Limitations to Significant Information in Biological Electron Microscopy as a Result of Radiation Damage", *J. Ultrastructure Research*, Vol. 36, 1971, pp. 466-482; and Hall, T. A. et al., "Beam-induced Loss of Organic Mass under Electronmicroprobe Conditions", *Journal of Microscopy*, Vol. 100, July 1973, pp. 177-188.

For the purposes of this invention, each unit 10 must be individually modifiable by an electron beam 14 which does not modify adjacent units and can be indexed to any selected unit 10. For this, the electron beam 14 must be focusable to a size comparable to that of an individual unit 10. In terms of the invented storage medium in which the size of a unit 10 is comparable to the size of a single organic molecule or virus, i.e., from several hundred Angstroms down to tens of Angstroms, the electron beam 14 must be focused to a corresponding comparable size of several hundred Angstroms or less, and must have sufficient intensity so that each selected unit can be modified quickly, to ensure a sufficiently short writing time. Typically, the electron beam 14 must provide a few electrons per square Angstrom per access time, where access time is the time necessary to detectibly modify the selected unit 10 (write in a bit of information). Such electron beam intensity can be provided for typical write access times of about 10 nanoseconds to about 1 microsecond per bit, i.e. for a write-in rate of from about 1 megabit to about 100 megabits per second, by devices of the type of the Crewe scanning electron microscope, discussed for example in: Crewe, A. V., "A High Resolution Scanning Electron Microscope", *Scientific American*, April 1971, pp. 26-35; or by scanning transmission electron microscopes of the type of the Perkin-Elmer STEM HFS-2S or the Coates and Welder Mod. 106 STEM. Such microscopes typically provide beam point current density of about $10^4$ to $10^5$ amp./cm$^2$ for a spot having a diameter of about 50 Angstroms or less and can deflect the beam with accuracy of one in $10^5$ to $10^6$ in each dimension, some using computer control (e.g. the Mod. 106 STEM).

When an individual unit 10 of the lattice shown in FIG. 1 is irradiated with an electron beam 14, it is modified through a mass-loss process which is believed to involve secondary emission of electrons, the rupture of covalent bonds and electrostatic disruption. Specifically, it is believed that when the primary electrons of the beam 14 interact with the particle 11 forming the unit 10, these primary electrons lose their energy mainly by producing secondary electron emission from the atoms of the particle 11. This is believed to weaken and break covalent bonds between parts of the unit 10, and to perhaps cause a positive charge on the particle 11, which is believed to produce a repulsive force between the irradiated particle 11 (or at least a part of it) and the remainder of the storage medium, thereby causing either the separation of the entire particle 11 forming the unit 10 from the storage medium or the local destruction and separation of a part of it from the remainder of the storage medium. It has been experimentally observed that rapid and large-scale mass loss of organic matter occurs under ionizing radiation causing total charge of about $10^{-3}$ to $10^{-2}$ coul./cm$^2$, which corresponds, to about 0.6 to 6 primary electrons passing through each square Angstrom of the target material. Since the storage medium is irradiated in vacuum, as described below, the separated particle 11 or portion thereof are drawn away in the vacuum. The result, as illustrated in FIG. 6, is that all or a portion of the irradiated unit 10 is missing from the space 10a, while the units 10 adjacent the irradiated unit 10 are not substantially affected. Note that while it is well established that some type of a mass-loss modification occurs under irradiation, the modification mechanism is not well understood, and other phenomena may in fact be involved. Note additionally that the electron beam 14 may come either from above or from below the storage medium, and may in fact be non-perpendicular to the plane of the medium.

While the resulting storage medium may be viewed immediately (without further processing) under an electron microscope to detect the location of the modified unit at 10a (i.e., the missing or partially missing unit 10a), it may be desirable to first stabilize the storage medium, so that further radiation would not destroy the information stored therein, and so that the stored information can be read easily and at high speed by an electron beam. For this purpose, a metal film 16 may be deposited onto the storage medium, e.g. by vacuum evaporation or sputtering from below as viewed in FIG. 1, to thereby form a thin metal film 16 on the bottom surface of the lattice. The metal film 16 may be continuous, as shown in FIG. 7, where the metal film 16 curves deeply toward the support 12 at the location 10a of the modified unit 10, but still remains continuous. Alternately, the metal film 16 may be, as illustrated in FIG. 7a, in the form of a cap 16b over each unmodified unit 10, possibly a background region 16d on the surface of the support 12 exposed between adjacent unmodified units 10, and a larger background region 16c on the exposed surface of the support 12 between the units 10 facing the modified unit. In either of the cases illustrated in FIGS. 7 and 7a, the metal region at the location 10a of the modified unit 10, or surrounding the location 10a, differs from the metal associated with unmodified units 10 in its response to an electron beam, and can be detected either by conventional electron microscopic techniques or by the technique described below for reading out the information stored in the invented storage media.

Figure 2:
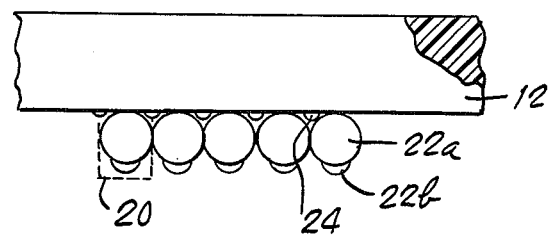

The alternate storage medium shown in FIG. 2 is similar to that discussed in connection with FIG. 1, differing only in that each unit 20 is formed by a particle 22a having a cap 22b formed of a material which is an isolator and preferably has high secondary emission properties. Background regions 24 may be formed of the same isolator material on the portions of the support 12 exposed between adjacent unit 20. It is believed that the caps 22b assist in the unit modifiction mechanism because the material for the caps can be selected to have a higher secondary emission coefficient than the remainder of the units 20. Specifically, it is believed that when the cap 22b of a unit 20 is irradiated by the beam 14, the positive electrostatic charge thereof due to secondary emission of electrons from the cap 22b is higher than that of the particle 22a alone, and if the adhesion of the cap 22b to the particle 22a is higher than that of the particle 22a to the remainder of the storage medium, modification of the irradiated unit 20 is facilitated. Note again that the modification mechanism is not fully understood, and this is only a hypothesis.

Figure 3:
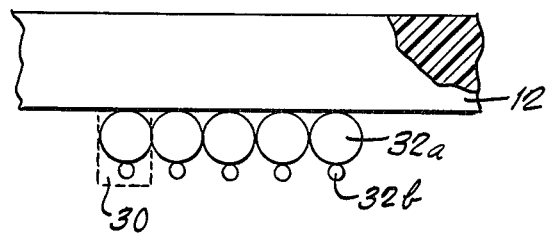

The still alternate storage medium illustrated in FIG. 3 differs from FIGS. 1 and 2 in that each unit 30 is formed of a larger particle 32a and a smaller particle 32b attached to each other, as by a chemical or other bond. When a unit 30 is irradiated with a beam 14, the smaller particle 32b breaks away from the larger particle 32a to which it was attached, through a mechanism which is believed to be similar to the modification mechanisms discussed above, with the result that a modified unit 30 is left with less mass than an unmodified unit. It is possible that only a part of the smaller particle 32b breaks away, and it is additionally possible that not only the smaller particle, but all or a portion of the larger particle 32a may break away from the medium.

Figure 4:
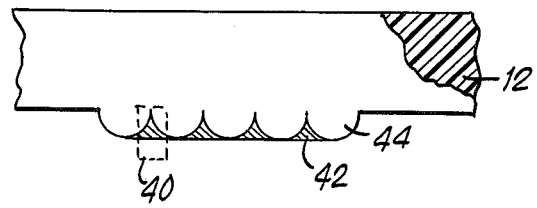

A still alternate storage medium is illustrated in FIG. 4 and comprises a support 12 into which is partly embedded a lattice of large particles 44, each particle 44 being about the size of a unit. The downwardly facing surface of the laterally extending regular lattice of particles 44 has the interstitial spaces between the particles 44 at least partly filled with regions 42 of a homogeneous insulator which preferably has high secondary emission properties, i.e., it can be easily locally charged with an electron beam. The adhesion between the particles 44 and the homogeneous insulator regions 42 can be relatively low, so that when a unit 40, formed of the homogeneous insulator region 42, is irradiated with an electron beam 14, the irradiated region 42 breaks away from the support 12 and the particles 44 either partly or completely, to thereby form a modified unit 40a (FIG. 9).

Figure 5:
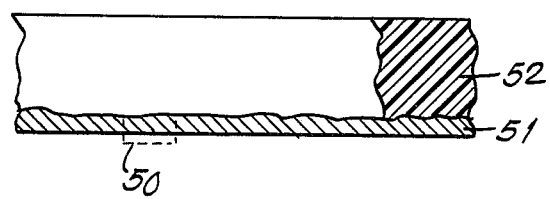

A still alternate storage medium is illustrated in FIG. 5 and comprises a support 52, which is a material formed of subparticles which are substantially smaller than a unit, and a thin layer 51 of a material formed of similar subparticles. A unit 50 of the material 51 is comparable in size to the units discussed in connection with FIGS. 1-4 (but is formed of a multiplicity of subparticles, each subparticle being, for example, a molecule). When irradiated by the electron beam 14, all or a part of the unit 50 breaks away from the support 52 and from adjacent portions of the thin layer 51, to thereby form a modified unit 50a (FIG. 10).

After selected units of the storage media shown in FIGS. 1 through 5 have been selectively modified to form structures of the type illustrated in FIGS. 6, 8, 10, and 14, and the modified structures have been stabilized to form the structures illustrated in FIGS. 7 and 7a, 9, 11, 13 and 15, respectively, the stored information may be read either by standard electron microscope techniques, or by a technique similar to that used for storing the information.

For storing the desired information into the invented storage medium, as discussed earlier the electron beam 14 must be focused down to a size about equal to or smaller than (or at least comparable to) that of an individual unit, and this can be done with an electron microscope of the types referenced above. Specifically, the invented storage medium is placed at the specimen location of the microscope, in vacuum, with the plane of the lattice transverse to the beam, the beam is indexed to the unit which should be modified, and the selected unit is irradiated with sufficient intensity and for a sufficient period of time to modify it.

Figure 16:
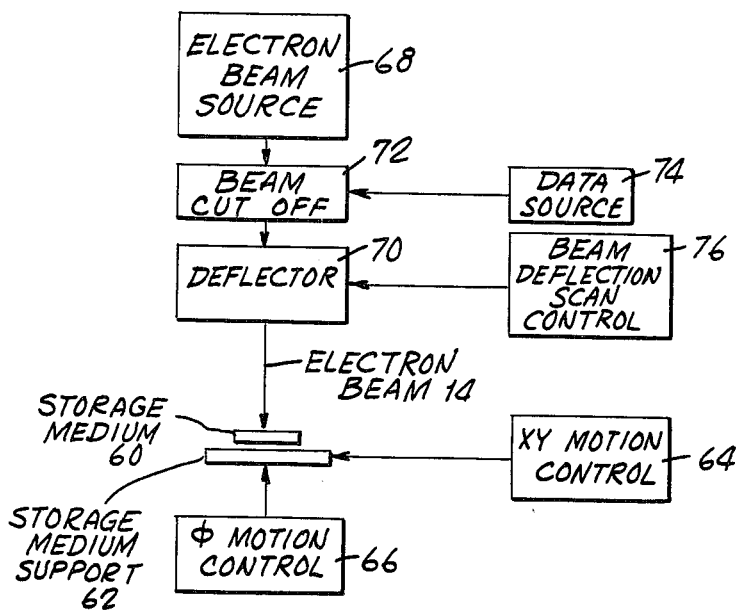
FIG. 16 illustrates a device for storing (writing in) information in the invented storage media and for subsequently stabilizing the media.

Referring to FIG. 16, which illustrates schematically the essential portions of a device for storing (writing) information in the invented medium, a storage medium 60 (which may be any of the media of FIGS. 1-5) is placed at the specimen location of a Crewe-type scanning electron microscope, on a specimen support 62 which is controlled for X,Y motion in a plane transverse to the beam by an X,Y motion control 64, and may additionally be controlled for rotational motion in its plane by another motion control 66. The specimen support 62 and the motion control 64 may be as in a conventional scanning electron microscope, or may be of the type described in U.S. Pat. Nos. 3,723,978 and 3,760,383. Alternately, the support 62 and the controls 64 and 66 may be of the type described in U.S. Pat. No. 3,541,338. The electron beam is generated at a souce 68 and its tip is deflected along the plane of the storage medium 60 by a deflector 70, as is standard in scanning electron microscopes. Additionally, there is a beam cutoff device 72, controlled by a data source 74 operating in synchronism with a beam deflection scan control device 76 which controls the deflector 70, so that the electron beam can be allowed to strike only those units of the storage medium 60 which are to be modified in accordance with the data provided by the data source 74. As discussed earlier, the size of the beam striking the units of the storage medium 60 must be comparable to the size of a single unit and the beam must have sufficient intensity to provide electron density of a few electrons per square Angstrom for the time interval necessary to modify a single unit, this interval being from about 10 nanoseconds to about 1 microsecond per bit.

To stabilize the storage medium after selected units thereof have been modified, a suitable metal (e.g. gold or uranium) is deposited thereon, to form the metallic film illustrated in the drawings, using — for example — vacuum deposition or sputtering techniques of the type used in the fabrication of integrated circuits.

Figure 17:
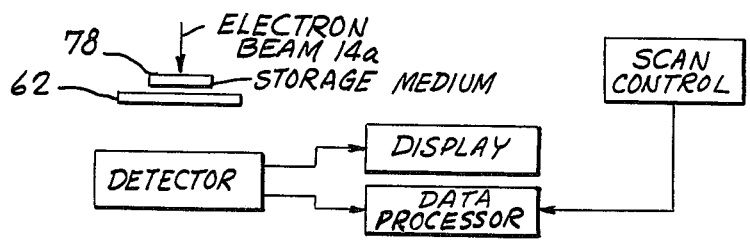
FIG. 17 illustrates a device for detecting (reading) the information stored in the invented storage media.

To read the recorded information, a stabilized storage medium 78 is placed on the same support 62 of the same type microscope, as illustrated in FIG. 17, and is scanned by the same type electron beam 14a to detect whether each unit accessed during the reading scan is modified or not. The reading beam's intensity may be the same as, or different from that of the writing beam. Any suitable detector 80, of the several type of detectors commonly used in scanning electron microscopes of the Crewe-type, can be used. The information may be displayed, as the scan progresses, at a display 82, which may be the standard display or a Crewe-type microscope, with the bit of information stored at each unit being identified by whether the location on the display 82 corresponding to the unit is bright or dark. Alternately, or additionally, the output of the detector 80 may be supplied to a data processor 84 operating in synchronism with the scan control 76 for conversion to a form suitable for other uses.

Figure 18:
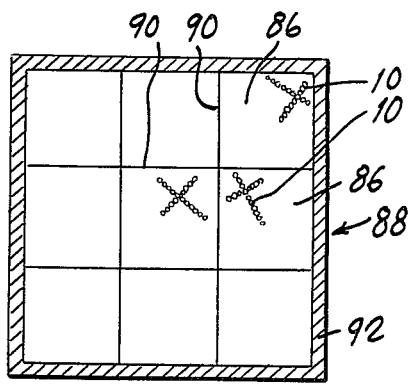
FIGS. 18 and 19 illustate arrays formed of individual storage media of the invented type separated from each other by a reference grid.
Figure 19:
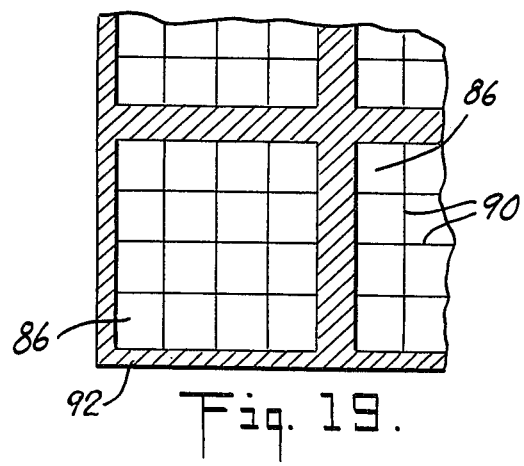

Referring to FIG. 18, a plurality of the invented storage media 86 may be arranged to form a larger array 88 comprising a rectangular arrangememt of individual lattices 86 separated from each other by a rectangular reference grid of metal bands 90, with the entire structure being surrounded by a wider metal border 92. Each of the metal bands 90 may be a heavy metal, such as gold or uranium, and may have the width of about 10 or more individual storage units, or can be about 0.5 microns wide, and the border 92 may be several times as wide as a band 90. The bands and borders may be formed by lithographic or integrated circuit masking and metal deposition techniques. Each of the storage media 86 may have, for example, about $10^4$ units per side, with a total storage capacity of about $10^8$ units (for $10^8$ bits of information). Of course, a larger capacity is possible, and any suitable capacity may be chosen. Any individual storage medium 86 may then be accessed by detecting the border 92 with the electron beam, then detecting the number of grid bands 90 which must be traversed in order to reach the desired storage medium 86. Then any individual storage unit within the selected medium 86 is accessed by calculating the number of units which must be traversed by the beam to reach the location of the desired unit, and deflecting the beam 14 accordingly, the calculation being based on knowing the lattice spread and the lattice origin. Furthermore, as illustrated in FIG. 19, several arrays 88 may be joined together on the same support, with the arrays 88 separated from each other by border strips 92, and with the media 86 within an array 88 separated from each other by the bands 90.

The metal bands 90, and borders 92, if any, are typically formed prior to storing (writing) any information into the storage media 86. The bands 90 and borders 92 have two distinct functions: to separate individual storage media 86 and arrays thereof from each other, and to assist in finding the lattice orientation within any individual storage medium 86. Specifically, after the band 90 is formed around a storage medium 86, the units overlayed by the band 90 are examined by the beam 14 without irradiating the units within the area surrounded by the band, in order to detect the lattice orientation, so that the lattice can be scanned by the beams 14 and 14a along a pattern corresponding to the rows and columns of the lattice. Still additionally, dislocation defects of any individual lattice may be detected by examining the orientation of the rows and columns of units underlying the bands 90 and the border 92, and any defective medium 86 may be discarded, or not used.

As specific examples: (1) each particle 11 in FIG. 1 can be a single Catalaze molecule (see Klug A. et al., An Optical Method for the Analysis of Periodicities in Electron Micrographs, and Some Observations on the Mechanism of Negative Staining, *J. Mol. Biol.* (1964) 10, 565–569), or — alternately — each particle 11 may be a single virus of the human G1 immunoglobin referenced above; (2) each particle 20 in FIG. 2 can be either of the particles referenced in (1) immediately above, with a cap of $SiO_2$ whose thickness is of the order of tens of Angstroms; (3) each particle 32a in FIG. 3 and each particle 44 in FIG. 4 can be either of the particles referenced in (1) immediately above, and each particle 32b can be any similar, but preferably smaller particle, which can be bonded to a particle 32a; (4) the insulator material forming each unit 40 in FIG. 4 can be $SiO_2$; (5) the material forming the layer 51 in FIG. 5 can be SiO or a mixture of SiO and $SiO_2$, with the thickness of the layer being of the order of tens of Angstroms; (6) the support 12 in FIGS. 1, 2, 3, and 4 can be an epoxy or Lucite type material formed in a layer or film which is 100 Angstroms thick or thicker; (7) the material for the support 52 can be the same as the material for the support 12; and ((8) the stabilizing metal and the material for the bands and borders can be gold or uranium.

In an exemplary operation of a molecular memory of the type described here, a target may be provided of approximately one square meter composed of many small molecular lattices embedded in a plastic matrix, each of the separate lattices being mounted on a wire mesh. A particular opening in the mesh is moved into position by a mechanical translation of the target. The electron beam is used to locate the edges of the wire and therefore determine the reference position for a lattice, and within the lattice the orientation of the molecular lattice is determined by examining the units in the bands or borders precoated with metal. The time for the mechanical motion is of the order of 50 to 500 milliseconds, and once the orientation of the lattice is determined, the time to position the beam to a defined unit within the lattice is of the order of 2 or 20 microseconds. Then a raster scan could be initiated during which the transfer rate is of the order of 1 to 10 megabits/sec. Provision would have to be made for coating a small region of the target with metal, without disturbing the rest of it. If the target is arranged so that the units are on a plastic backing away from the electron source, then low voltage electrons are used to find the positions of the wire while higher voltage electrons, or perhaps 25 to 50 milovolts, are used to address the selected molecular memory units, which would then be on the bottom of the plastic.

I claim:
1. An information storage medium comprising:
   a substantially continuous and regular lattice of bit storage units arranged side-by-side to form a layer, each unit being less than about 1000 Angstroms in size, and each unit comprising material modifiable when individually irradiated by a focused electron beam, wherein the modification of one unit does not substantially modify units adjacent thereto, each storage unit storing one binary bit of information; and a support attached to the lattice and supporting the information bit storage units thereof.

2. An information storage medium as in claim 1 wherein the units of an unmodified lattice are substantially identical to each other and each lattice unit is selected from the group consisting of: a single organic molecule, a single virus, a single organic molecule having an insulator material cap attached thereto, a single virus having an insulator material cap attached thereto, a larger and a smaller organic molecule attached to each other, a larger and a smaller virus attached to each other, an insulator region in the interstitial space between adjacent particles of a regular lattice, and a region of a material formed of subparticles which are substantially smaller in size than a unit.

3. An information storage medium comprising a substantially continuous lattice of bit storage unit, arranged side-by-side to form a layer, each unit being hundreds of Angstroms or less in size, said lattice comprising units in a first state and units in a second state, each unit in a first state storing one binary bit of information and each unit in a second state storing the complementary binary bit of information, each transition between a unit in a first state and an adjacent unit in a second state responding differently to an irradiating electron beam than a transition between two adjacent units which are in the same state.

4. An information storage medium comprising a lattice of bit storage units and a metallic layer overlaying the lattice units, said lattice units storing respective binary information bits, each unit being of the order of hundreds of Angstroms or less in size, wherein the metallic layer adjacent one or more selected units of the lattice has a first selected orientation and the metallic layer adjacent the remaining lattice units has a second selected orientation, said first and second selected metallic layer orientations being substantially different from each other and causing the respective units to have a substantially different response to an irradiating electron beam, said response identifying the information bits stored in the units.

5. An information storage medium comprising a regular lattice of units, said units storing respective binary information bits, each unit being hundreds of Angstroms or less in size, with one or more selected lattice units being substantially different from the remaining lattice units in their response to selected electron radiation, wherein said selected units are substantially identical to each other in said response and the remaining units are substantially identical to each other in said response, said response identifying the information bits stored in the units.

6. An information storage medium comprising a plurality of laterally adjacent regular lattices of bit storage units arranged side-by-side to form a thin layer, each lattice being substantially continuous, each unit being hundreds of Angstroms or less in size and storing one bit of binary information by the presence or lack of a permanent and irreversible modification thereof, and a reference grid separating the lattices from each other and formed of a material whose electron beam response is substantially different from that of at least a portion of the lattice units.

7. An information storage system comprising:

a storage medium comprising a regular lattice of bit storage units, each unit being hundreds of Angstrom or less in size; and means for selectively modifying individual units of the lattice permanently and irreversibly, to thereby store binary information in said storage medium as a pattern of modified lattice units.

8. A system as in claim 7 including means for stabilizing the storage medium after modifying selected units thereof by depositing a metallic layer on the lattice units, wherein the metallic layer portion adjacent a modified lattice unit differs from the metallic layer portion adjacent an unmodified lattice unit.

9. An information storage system comprising:

a storage medium comprising a regular lattice of bit storage units, each unit being hundreds of Angstroms or less in size, with selected lattice units having electrom beam response which is substantially different from that of the remaining lattice units; and means for selectively detecting and identifying said selected lattice units.

10. An information storage medium as in claim 3 wherein the units are arranged in a substantially regular two-dimensional lattice.

* * * * *